United States Patent
Takahashi et al.

(10) Patent No.: US 7,397,719 B2
(45) Date of Patent: Jul. 8, 2008

(54) VOLATILE SEMICONDUCTOR MEMORY

(75) Inventors: Hiroyuki Takahashi, Kanagawa (JP); Hiroyuki Matsubara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 112 days.

(21) Appl. No.: 11/431,505

(22) Filed: May 11, 2006

(65) Prior Publication Data
US 2006/0256637 A1 Nov. 16, 2006

(30) Foreign Application Priority Data
May 12, 2005 (JP) ............................ 2005-139773
Dec. 1, 2005 (JP) ............................ 2005-347415

(51) Int. Cl.
*G11C 7/00* (2006.01)
(52) U.S. Cl. .................... 365/222; 365/185.08; 365/228
(58) Field of Classification Search ............ 365/189.02, 365/201, 222, 189.04, 189.07, 225.7, 96; 326/104; 327/525
See application file for complete search history.

(56) References Cited

U.S. PATENT DOCUMENTS

| | | | | |
|---|---|---|---|---|
| 5,818,772 A | * | 10/1998 | Kuge | 365/201 |
| 6,310,807 B1 | * | 10/2001 | Ooishi et al. | 365/200 |
| 6,728,156 B2 | * | 4/2004 | Kilmer et al. | 365/222 |
| 2005/0281112 A1 | * | 12/2005 | Ito et al. | 365/222 |

FOREIGN PATENT DOCUMENTS

JP 11-238393 8/1999

* cited by examiner

*Primary Examiner*—Harry W Byrne
(74) *Attorney, Agent, or Firm*—Young & Thompson

(57) ABSTRACT

A volatile semiconductor memory includes a self-test controller detecting a defect of a memory cell, and an address storage storing a defective address indicating an address of a defective memory cell, and a refresh adjust circuit setting a refresh cycle of a memory cell designated by the defective address to be shorter than a refresh cycle of a normal memory cell.

19 Claims, 13 Drawing Sheets

VOLATILE SEMICONDUCTOR MEMORY

BACKGROUND OF THE INVENTION

1. Field of the Invention

The present invention relates to volatile semiconductor memory and, more particularly, volatile semiconductor memory with increased redundancy for a defective memory cell.

2. Description of Related Art

Recently, volatile semiconductor memory such as dynamic random access memory (DRAM) is widely used as memory incorporated into a mobile phone or the like. With a recent increase in the amount of data processed in equipment, a memory capacity increases accordingly. The large capacity memory includes a large number of memory cells, and each device needs to maintain a performance that meets specifications. It is, however, difficult to manufacture all of an enormous amount of memory cells within the range of specifications due to manufacturing variations in memory cells, crystal defects of a semiconductor substrate or dust which are inevitable in manufacturing, and so on.

In order for the memory to have redundancy for defects in memory cells, a spare memory cell is generally prepared to replace a defective memory cell. The memory cell which is determined to be defective by pre-shipment inspection may be replaced with a spare memory cell by using a fuse or the like. This enables shipment of normal memory. However, even with the use of this memory, thermal stress after shipment, such as heat due to soldering and use, aged deterioration and so on cause degradation of the performance of the memory cell, making the memory cell defective. In this case, the use of the spare memory cell cannot prevent defects.

DRAM stores data by accumulating charges in a capacitor. The accumulated charges, however, decrease with time due to leakage current. Therefore, DRAM refreshes to recharge the capacitor at certain time intervals (cell hold time). If the memory cell is degraded after shipment, DRAM can be unable to retain data in spite of refreshing due to increased leakage current.

An approach to overcome this drawback is to incorporate a circuit to add redundancy for a defective memory cell into DRAM so as to have redundancy for defects after shipment. An example of this circuit (memory cell redundant circuit) is disclosed in Japanese Unexamined Patent Application Publication No. 11-238393.

FIG. 12 shows DRAM 1000 of related art. In the DRAM 1000 shown in FIG. 12, BIST circuit 1001 performs self-test on a memory cell 1007 each time power is turned on, and then stores the address of the memory cell 1007 determined to be defective as a result of the self-test. FIG. 13 shows the flowchart of the self-test. In normal use state, the DRAM 1000 compares an address input from a logic circuit 1008 with the stored defective address. If, as a result of the comparison, the input address matches the defective address, the DRAM 1000 generates an address of a spare memory cell 1006 and uses the spare memory cell 1006 instead of the defective memory cell.

This configuration allows the performance of DRAM to meet the specifications with the use of the spare memory cell 1006 even if a defective memory cell occurs. Further, since the self-test is performed each time DRAM is powered-on, the DRAM can have redundancy for a defective memory cell after shipment as well.

However, it has now been discovered that the memory cell redundant circuit of related art needs to compare all the addresses supplied from a logic circuit in normal use state with the stored defective address, which causes a decrease in access speed. Further, the spare memory cell may be placed apart from other normal memories, and a long wiring also causes a decrease in access speed. Furthermore, it is necessary to prepare a spare memory cell in order to replace a defective memory cell, which causes an increase in chip area.

SUMMARY OF THE INVENTION

According to an aspect of the present invention, there is provided a volatile semiconductor memory which includes a self-test controller detecting a defect of a memory cell, and an address storage storing a defective address indicating an address of a defective memory cell, and a refresh adjust circuit setting a refresh cycle of a memory cell designated by the defective address to be shorter than a refresh cycle of a normal memory cell.

The volatile semiconductor memory of the present invention sets the refresh cycle for a defective memory cell to be shorter than the refresh cycle for a normal memory cell, thereby allowing the memory cell which operates but whose charge holding characteristics are degraded to meet the charge holding characteristics in accordance with the specifications. This enables reduction of the number of defective volatile semiconductor memories. Further, it eliminates the need for replacing a defective memory cell with a spare memory cell, enabling reduction in chip area. Furthermore, it allows the memory access without converting an external address into an address of a spare memory cell, thus enabling an increase in access speed.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
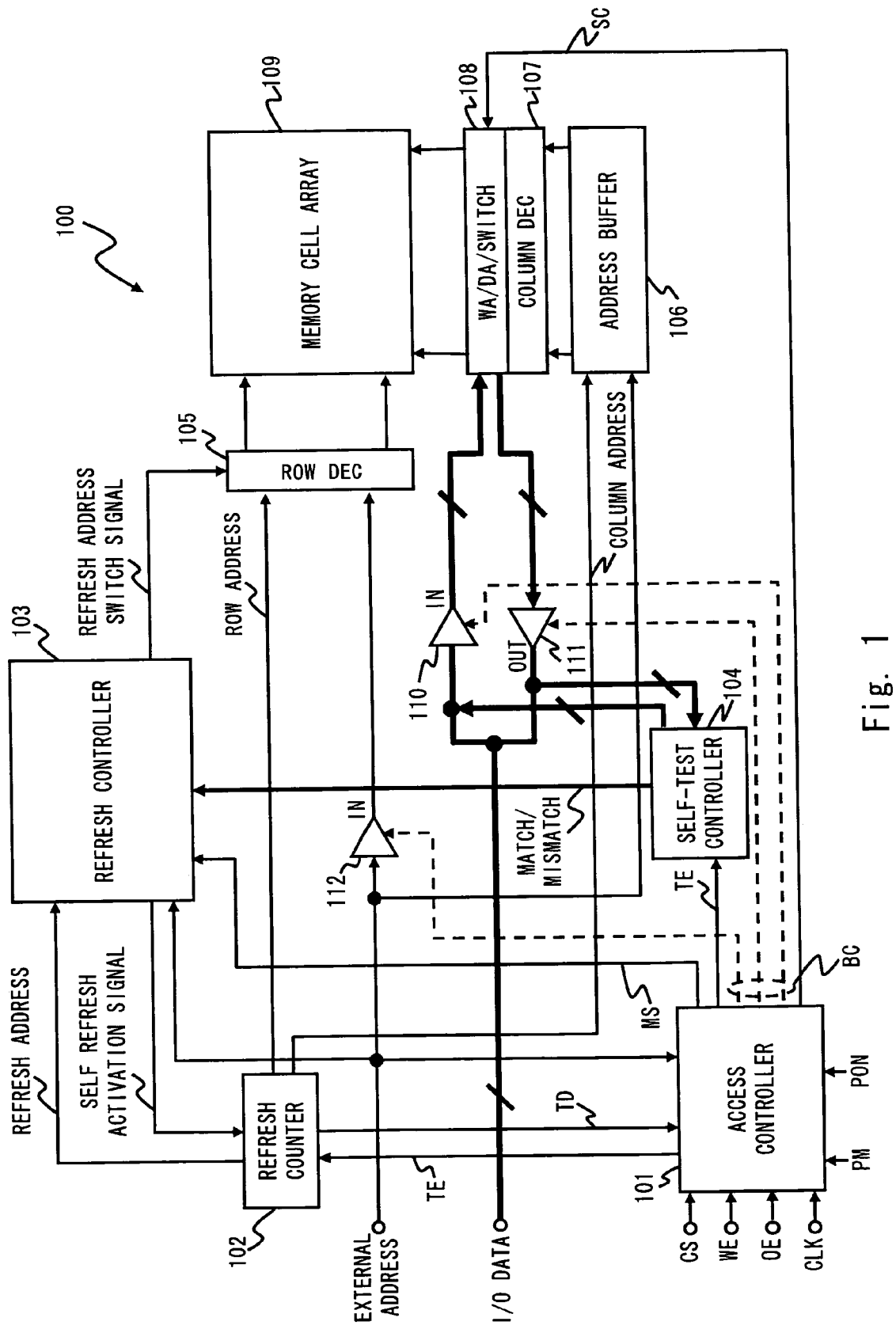
FIG. 1 is a block diagram of DRAM according to a first embodiment of the invention.

FIG. 1 shows a volatile semiconductor apparatus (e.g. dynamic random access memory: DRAM) 100 according to a first embodiment of the invention. The DRAM 100 shown in FIG. 1 includes an access controller 101, a refresh counter 102, a refresh controller 103, a self-test controller 104, a row DEC 105, an address buffer 106, a column DEC 107, a WA/DA/switch 108, a memory cell array 109, an input buffer 110, an output buffer 111 and an address input buffer 112.

The access controller 101 controls internal blocks according to input signals supplied from outside of the DRAM 100. The access controller 101 receives, from outside of the DRAM 100, a chip select signal CS which indicates the selection of a chip, a write signal WE, a read signal OE, a clock signal CLK which operates the DRAM 100, a power-on signal PON which is active when the DRAM 100 is powered on, and a product mode signal PM which invalidates the self-test function during shipping inspection or the like. The access controller 101 outputs a test enable signal TE which indicates the self-test mode according to the power-on signal PON to the refresh counter 102 and the self-test controller 104. Further, the access controller 101 receives a test disable signal TD which indicates the completion of self-test from the refresh counter 102. The self-test is a self-diagnosis test for detecting defects of a memory cell. The self-test is described in detail later.

The access controller 101 further outputs a mode selection signal MS which designates self-test mode, write mode or read mode to the refresh controller 103. According to each mode of the self-test mode, write mode and read mode, the access controller 101 outputs a buffer control signal BC which designates the operating state or the stopped state to an input buffer 110, an output buffer 111 and an address input buffer 112. In addition, the access controller 101 outputs a switch control signal SC to the WA/DA/switch 108 which switches the connection between the memory cell array 109 and the input buffer 110 or the output buffer 111 according to the mode.

The refresh counter 102 generates an address for the self-test or the refresh operation. When performing the self-test, the refresh counter 102 outputs a row address and a column address according to the test enable signal TE supplied from the access controller 101. When performing the refresh operation, the refresh counter 102 outputs a refresh address (e.g. a row address to be refreshed) to the refresh controller 103 according to its counter. The refresh counter 102 receives a refresh activation signal from the refresh controller 103. According to the refresh activation signal, the refresh counter 102 outputs one or both of the refresh address and a defective address. The defective address is described in detail later.

The refresh controller 103 is a circuit to control the refresh operation of the DRAM 100 according to the row address (defective address) of the defective memory cell stored by the self-test, the external address input from the outside, and the refresh address generated by the refresh counter 102. The self-test controller 104 holds the data to be written to a memory cell and an expected value of the data read from the memory cell when executing the self-test and compares the data read from the memory cell with the expected value to determine whether they match or not. The refresh controller 103 and the self-test controller 104 are described in detail later.

The row DEC 105 is a circuit to control the access to the memory cells arranged in a row in the memory cell array 109. In the access control to the memory cells, the row DEC 105 designates the row of the memory cell to be refreshed by the row address supplied from the refresh counter 102. Further, it designates the row of the memory cell on which data is to be written or read by the external address supplied from outside of the DRAM 100 through the address input buffer 112.

The row DEC 105 receives a refresh address switch signal from the refresh controller 103. The row DEC 105 activates memory cells sequentially from the address for either one of memory access or refresh operation which has an priority according to the refresh address switch signal.

The address buffer 106 is a circuit to receive an external address and transmit it to the column DEC 107. In the self-test mode, the address buffer 106 transmits the column address supplied from the refresh counter 102 to the column DEC 107. In the write mode or the read mode, the address buffer 106 transmits the external address supplied from outside of the DRAM 100 to the column DEC 107.

The column DEC 107 is a circuit to control the access to the memory cells arranged in a column in the memory cell array 109. The column DEC 107 designates the column of the memory cell to be accessed according to the input from the address buffer 106. The memory cell to be accessed is identified by the row DEC 105 and the column DEC 107 designating the row and column of the memory cell array 109.

The WA/DA/switch 108 includes a write amplifier WA serving as a buffer circuit to write data, a data amplifier DA serving as a buffer circuit to read data, and a switch to switch between the write amplifier WA and the data amplifier DA. In the write mode, the switch selects the write amplifier WA according to the switch control signal SC from the access controller 101 and writes data to the memory cell array 109. In the read mode, the switch selects the data amplifier DA according to the switch control signal SC and reads data from the memory cell array 109. The memory cell array 109 is a group of memory cells which are arranged in a lattice, for example.

The input buffer 110 transmits the data supplied from the outside to the write amplifier WA of the WA/DA/switch 108. The output buffer 111 outputs the data output from the data amplifier DA of the WA/DA/switch 108 to the outside. The address input buffer 112 transmits an external address to the row DEC 105.

Figure 2:
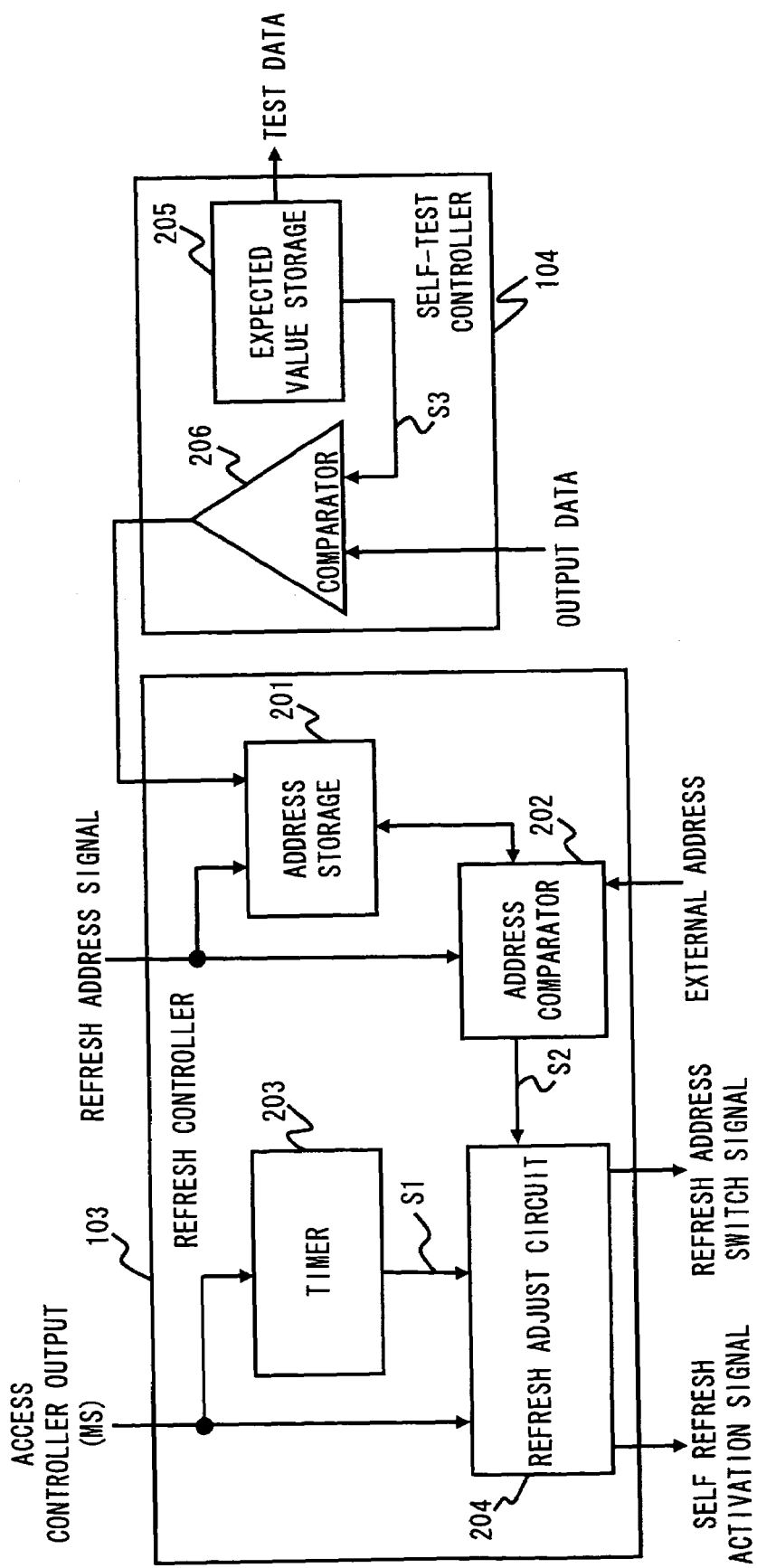
FIG. 2 is a block diagram of a refresh controller and a self-test controller according to the first embodiment of the invention.

The refresh controller 103 and the self-test controller 104 are described in further detail herein. FIG. 2 shows the configuration of the refresh controller 103 and the self-test controller 104.

The refresh controller 103 includes an address storage 201, an address comparator 202, a timer 203 and a refresh adjust circuit 204.

The address storage 201 stores the refresh address output from the refresh counter 102 when the match/mismatch signal output from the self-test controller 104 indicates mismatch. Thus, the address stored at this time is a defective address which indicates the address of a defective memory cell.

The address comparator 202 compares the refresh address supplied from the refresh counter 102, the defective address supplied from the address storage 201 and the external address supplied from outside of the DRAM 100 and transmits the comparison result to the refresh adjust circuit 204.

The timer 203 receives a mode selection signal MS from the access controller 101. The timer 203 sets a refresh cycle according to the mode selection signal MS. The refresh cycle set by the timer 203 is supplied to the refresh adjust circuit 204 as a refresh cycle setting signal S1.

The refresh adjust circuit 204 receives the mode selection signal MS, the refresh cycle setting signal S1 and the output S2 of the address comparator 202. When the mode selection signal MS indicates the write mode or the readmode, the refresh adjust circuit 204 generates a refresh address switch signal which designates which of the memory access and the refresh operation should be given priority by the row DEC 105 according to the refresh cycle setting signal S1 and the output S2 of the address comparator 202, and a self refresh activation signal which designates a row address to be refreshed according to the refresh cycle setting signal S1.

The self-test controller 104 includes an expected value storage 205 and a comparator 206. The expected value storage 205 outputs the data to be written to the memory cell array 109 and also outputs an expected value S3 where the data once written to the memory cell array 109 is read out as it is. The write data is input to the WA/DA/switch 108 through the input buffer 110.

The comparator 206 compares the data read from the memory cell array 109 through the WA/DA/switch 108 and the output buffer 111 with the expected value S3 and outputs a match/mismatch signal to the refresh controller 103. If the read data and the expected value S3 match as a result of the comparison, the comparator 206 outputs a match signal and, if they do not match, the comparator 206 outputs a mismatch signal.

The operation of the DRAM 100 according to the first embodiment is described hereinafter in detail. The DRAM 100 has self-test mode, write mode and read mode. The modes are switched according to the power-on signal PON, write signal WE and read signal OE which are supplied to the access controller 101 from outside of the DRAM 100.

Figure 3:
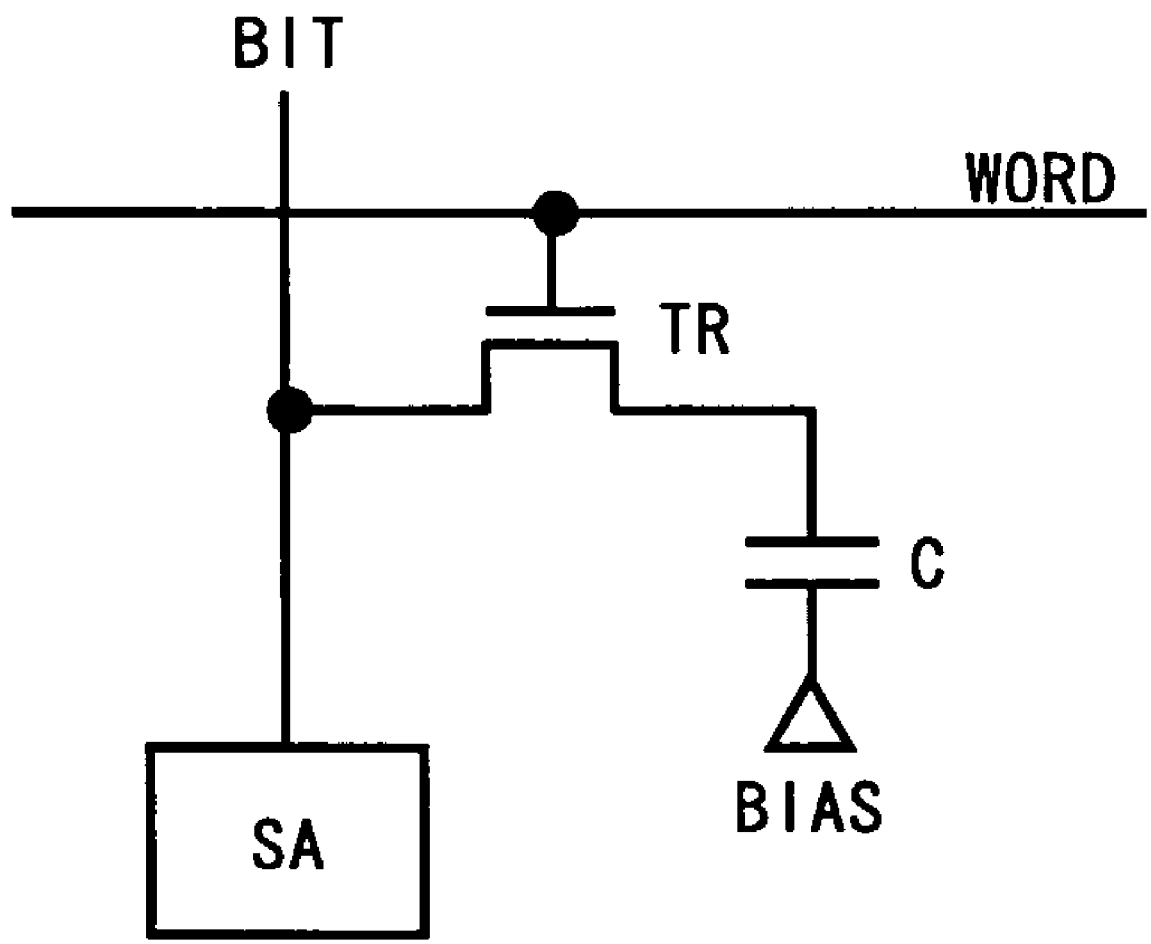
FIG. 3 is a circuit diagram of a memory cell according to the first embodiment of the invention.

The self-test mode is described herein. The self-test is described in detail first. The self-test tests whether a memory cell has the data holding characteristics that meet the specifications. FIG. 3 shows a circuit diagram of one memory cell. The memory cell has a word line whose activation state is specified by the row address, a bit line whose activation state is specified by the column address, a capacitor C which stores data, a transistor Tr which controls the input/output and the storage of data in the capacitor C, and a sense amplifier SA which writes or reads data. The gate of the transistor is connected to the word line, the drain is connected to the bit line, and the source is connected to a prescribed voltage BIAS through the capacitor C.

When writing data to the memory cell, the word line is selected so that the transistor Tr is rendered conductive and the sense amplifier SA outputs a power supply voltage, for example. A charge corresponding to the power supply voltage is thereby accumulated in the capacitor C and thus "1" is stored. After that, the word line becomes unselected so that the transistor Tr is rendered nonconductive and the charge accumulated in the capacitor C is retained. When reading data from the memory cell, the voltage corresponding to the charge accumulated in the capacitor C is supplied to the sense amplifier SA while the word line is selected, thereby transmitting the voltage to the data amplifier DA connected in the subsequent stage of the sense amplifier SA.

When writing "0" to the memory cell, the sense amplifier SA outputs a ground voltage, for example. In this case, no charge is accumulated in the capacitor C, and thereby "0" is stored.

In this way, the DRAM 100 writes data to the memory cell. However, the memory cell has junction leakage current, which causes a decrease in the amount of charges accumulated in the capacity C over time even when the transistor Tr is nonconductive.

Figure 4:
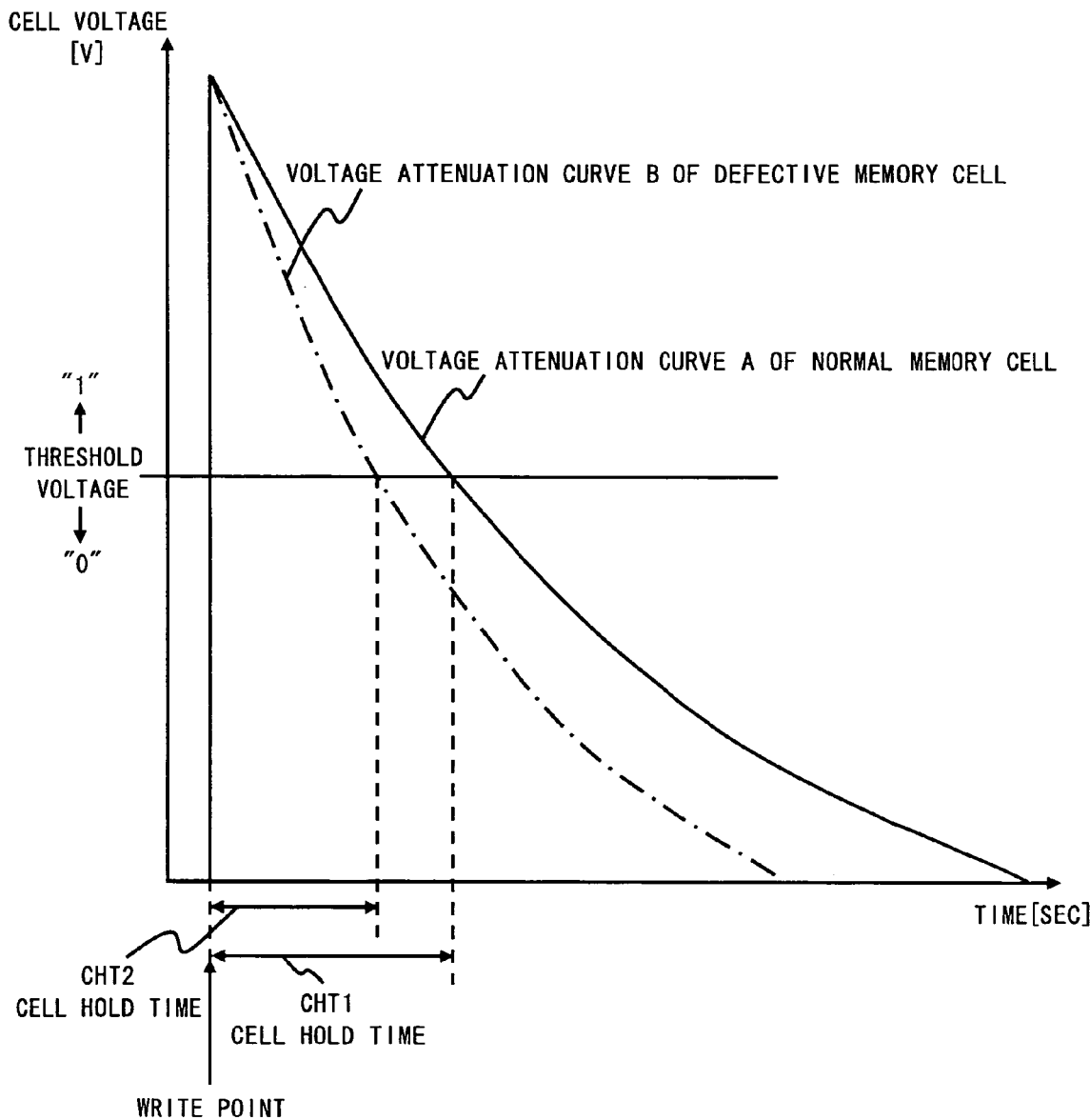
FIG. 4 is a graph of the voltage holding characteristics of a memory cell according to the first embodiment of the invention.

A voltage attenuation curve of a normal memory cell is shown in full line A in FIG. 4. FIG. 4 shows a discharge state when a power supply voltage corresponding to "1" is written to a memory cell. A cell hold time CHT 1 shown in FIG. 4 is a time required by the normal memory to reach a voltage (threshold voltage) at a boundary where a circuit in a subsequent stage after writing can correctly determine the voltage level as "1". Thus, the refresh cycle is generally set to be shorter than the cell hold time CHT 1.

However, a defective memory cell has larger leakage current than a normal memory cell, and, with the refresh cycle of the normal memory cell, a cell voltage at the time of refresh can be lower than the threshold voltage. A voltage attenuation curve of a defective memory cell is shown in dashed line B in FIG. 4. As shown in FIG. 4, a cell hold time CHT 2 in the defective memory cell is shorter than the cell hold time CHT 1. Therefore, if the refresh cycle is longer than the cell hold time CHT 2 and shorter than the cell hold time CHT 1, the defective memory cell can output false data. Thus, the normal cell has no defect. The cell hold time of the normal cell is more than predetermined value (e.g. a product specifications). The defective memory cell has defect. The cell hold time of the defective cell is less than predetermined value (e.g. a product specifications).

Figure 5:
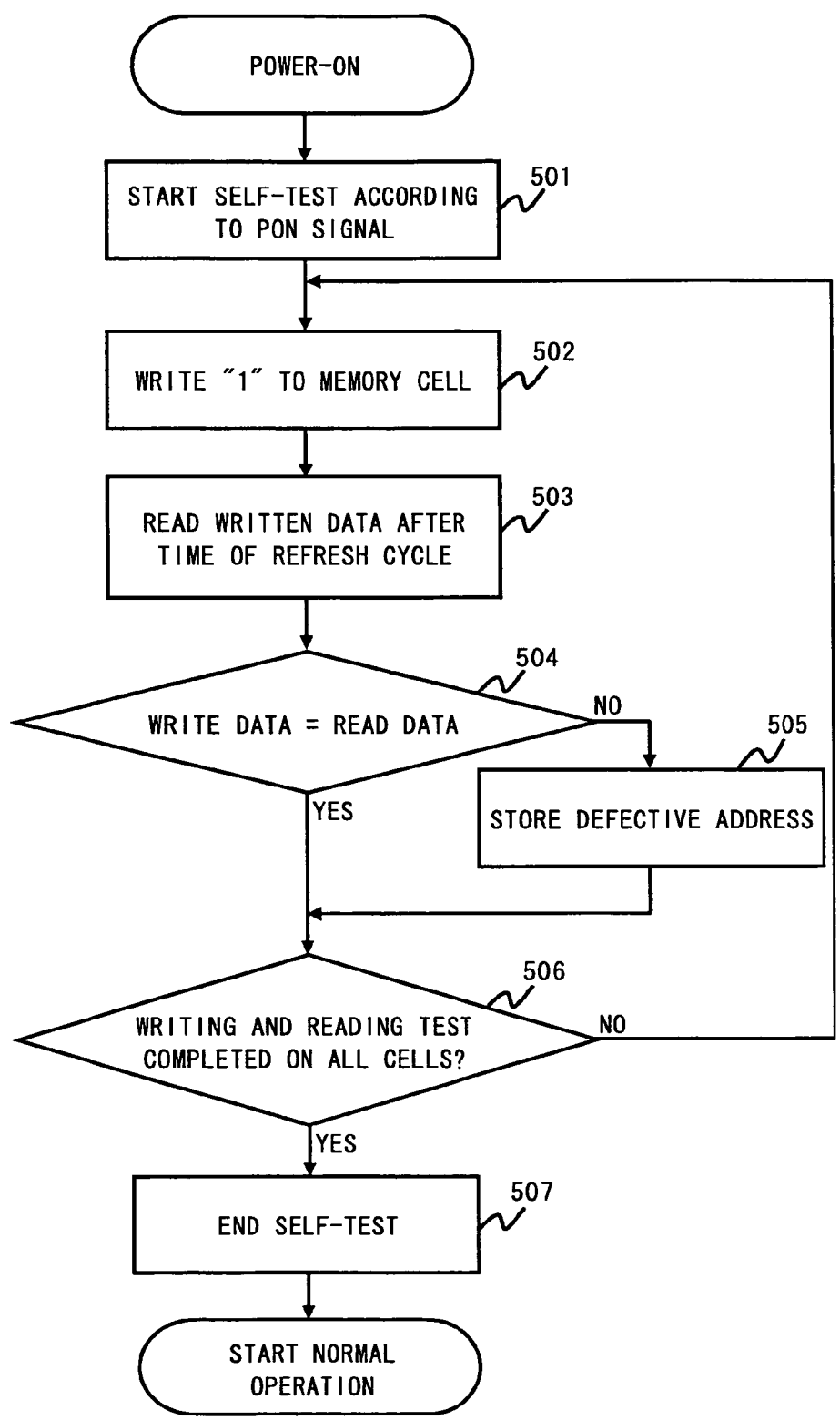
FIG. 5 is a flowchart of self-test according to the first embodiment of the invention.

The self-test detects the defective memory cell as described above and stores the address of the defective memory cell. FIG. 5 shows the flowchart of the self-test.

As shown in FIG. 5, the self-test is started according to the power-on signal PON which is input after the DRAM 100 is powered on (Step 501). Then, it writes "1" to the memory cell (Step 502). After a period of time corresponding to a refresh cycle has passed, the test reads the data again (Step 503). Then, the test compares the write data and the read data (Step 504). If the comparison result in Step 504 shows that the data do not match, the test stores the address of the memory cell from which data has been read as a defective address (Step 505). If, on the other hand, the comparison result in Step 504 shows that the data match, the test proceeds to the next step without storing the address. After completing the processing of Steps 504 and 505, the test determines whether the write data in all memory cells have been read (Step 506). If the write data in all memory cells have not been read, the test repeats the processing of Steps 502 to 506. Upon completion of reading the data in all memory cells, the test ends the process (Step 507). After that, the normal operation of the DRAM 100 is started. The normal operation is described in detail later.

The self-test is executed following the flowchart described above. The circuit operation in the self-test is described herein.

When the DRAM 100 is powered on, the power-on signal PON is input to the access controller 101. According to the PON signal, the access controller 101 supplies a test enable signal TE to the refresh counter 102 and the self-test controller 104.

Receiving the test enable signal TE, the refresh counter 102 generates a row address and a column address of a memory cell where data is to be written. The address generation is performed for the addresses of all the memory cells in the memory cell array 109.

Also receiving the test enable signal TE, the self-test controller 104 generates write data (test data) and supplies it to the WA/DA/switch 108 through the input buffer 110. The write test data is "1" for all memory cells. The write test data and the expected value S1 are the same signals.

The data is written to the memory cell, and after a period of time corresponding to the refresh cycle has passed, the write data is read out. The read data is supplied from the memory cell array 109 through the WA/DA/switch 108 and the output buffer 111 to the self-test controller 104 where it is compared with the expected value S1 in the comparator 206. If the read data matches the expected value S1, the self-test controller 104 transmits a match signal to the refresh controller 103. If, on the other hand, the read data does not match the expected value S1, the self-test controller 104 transmits a mismatch signal to the refresh controller 103.

If the refresh controller 103 receives the mismatch signal from the self-test controller 104, it stores the address of the mismatched memory cell as a defective address into the address storage 201. If, on the other hand, the refresh controller 103 receives the match signal from the self-test controller 104, it does not store the address of the memory cell.

The self-test is completed when the refresh counter 102 generates the addresses for reading and writing on all the memory cells. Upon completion of the address generation, the refresh counter 102 transmits a test disable signal TD to the access controller 101. The self-test thereby ends.

It is feasible to shorten the test time by reducing the accumulation of charges to the capacitor C of the memory cell. For example, the voltage to activate the word line may be set lower than the voltage in the normal operation, or the BIAS voltage may be set higher than the voltage in the normal operation.

A period of time corresponding to the refresh cycle described above may be set in accordance with the temperature characteristics of the cell hold time. Specifically, the cell hold time is long under low temperature while it is short under high temperature. Setting the refresh cycle in accordance with the temperature characteristics enables the measurement with a certain degree of margin with respect to a product model of the memory cell regardless of the ambient temperature where the DRAM 100 is used. This allows the more accurate measurement of the performance of the memory cell.

If the self-test is carried out during product shipping inspection, defects of the product cannot be eliminated in some cases. To avoid this, it is feasible to invalidate the self-test function by the product mode signal PM.

Upon completion of the self-test described above, the DRAM 100 enters the normal operation to perform writing and reading of external data. The normal operation of the DRAM 100 is detailed herein. The normal operation comprises the write mode which stores data into a memory cell, the read mode which reads stored data, and the refresh operation which is performed constantly during the normal operation.

The write mode is described first. In the write mode, the chip select signal CS is active and the write signal is also active. In this case, an external address which designates a memory cell is input from outside through an external address terminal. Further, write data corresponding to the external address is input through an I/O data terminal. According to the external address, the row DEC 105 and the column DEC 107 designate a memory cell of the memory cell array 109. To the designated memory cell, the write data is supplied through the input buffer 110 and the write amplifier SA of the WA/DA/switch 108. The write data is thereby stored in the memory cell designated by the external address.

The read mode is described herein. In the read mode, the chip select signal CS is active and the read signal is also active. In this case, an external address which designates a memory cell is input through the external address terminal. According to the external address, the row DEC 105 and the column DEC 107 designate a memory cell of the memory cell array 109. The data stored in the designated memory cell is output from the I/O data terminal through the data amplifier DA of the WA/DA/switch 108 and the output buffer 111. The data is thereby read from the memory cell.

Figure 6:
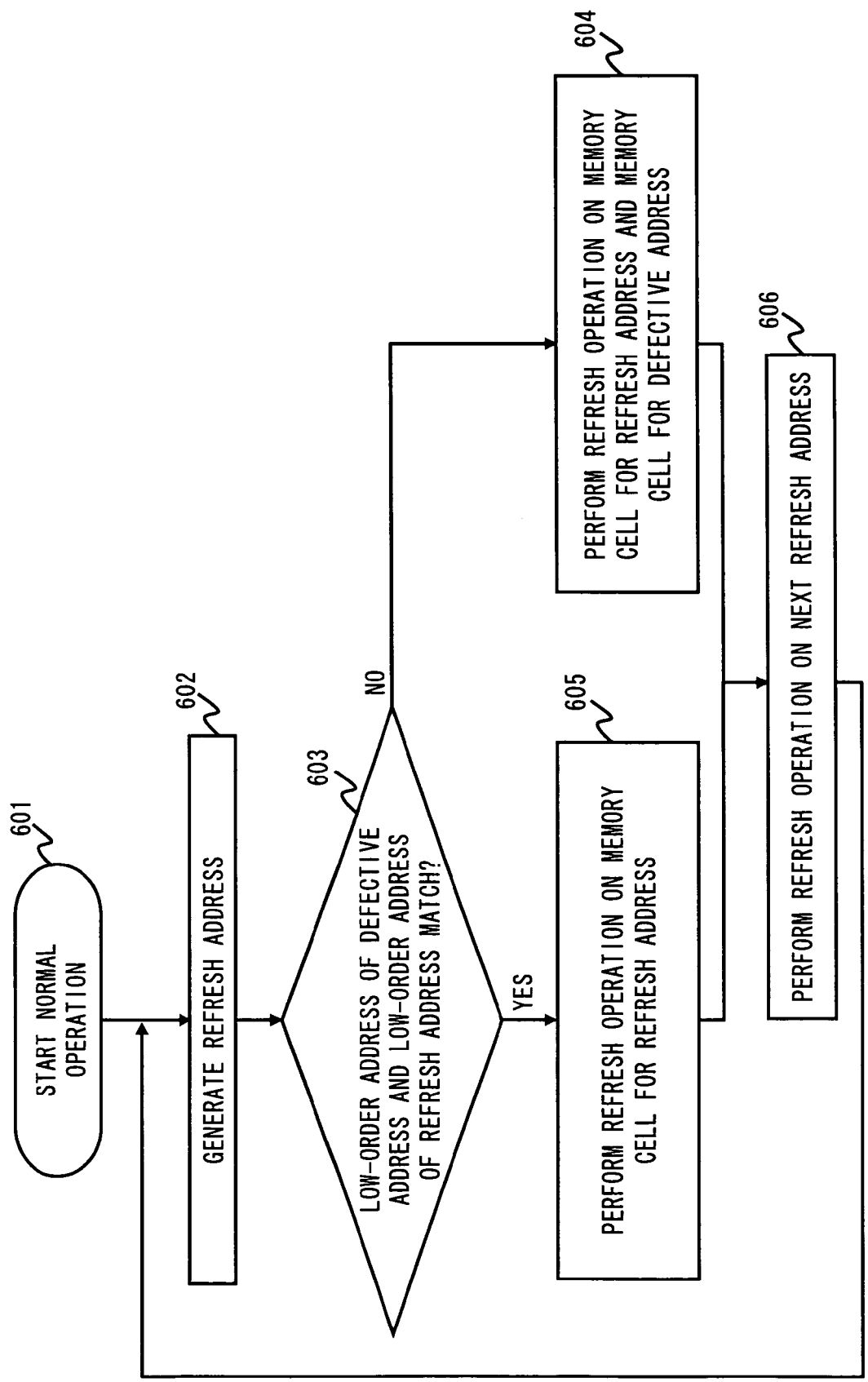
FIG. 6 is a flowchart of refresh operation according to the first embodiment of the invention.

The refresh operation is described herein. The refresh operation is repeatedly performed during the normal operation of the DRAM 100. FIG. 6 shows the flowchart of the refresh operation. The refresh operation is described with reference to FIG. 6. Upon completion of the self-test, the normal operation is started (Step 601). When the normal operation is started, the refresh counter 102 generates a refresh address (Step 602).

The refresh address is input to the refresh controller 103. The refresh controller 103 compares a low-order address of the defective address stored in the address storage 201 with a low-order address of the refresh address (Step 603). If the low-order address of the defective address and the low-order address of the refresh address match, the refresh adjust circuit 204 outputs a self refresh activation signal for both rows of the memory cells corresponding to the defective address and the refresh address. According to the self refresh activation signal, the refresh counter 102 transmits the refresh address and the defective address to the row DEC 105. The designated two rows of memory cells are thereby refreshed (Step 604).

On the other hand, if the low-order address of the defective address and the low-order address of the refresh address do not match, the refresh adjust circuit 204 outputs a self refresh activation signal only for the row of the memory cells corresponding to the refresh address. According to the self refresh activation signal, the refresh counter 102 transmits the refresh address to the row DEC 105. The designated row of memory cells is thereby refreshed (Step 605).

The refresh counter 102 repeatedly generates refresh addresses. The DRAM 100 thereby repeatedly performs the refresh operation (Step 606). Specifically, the refresh operation is performed repeatedly on each row of memory cells at the refresh cycle set by the timer 203. In addition, the refresh operation on the defective memory cell is performed at a shorter cycle than the normal refresh cycle by the operation of the refresh adjust circuit 204 in this embodiment.

Figure 7:
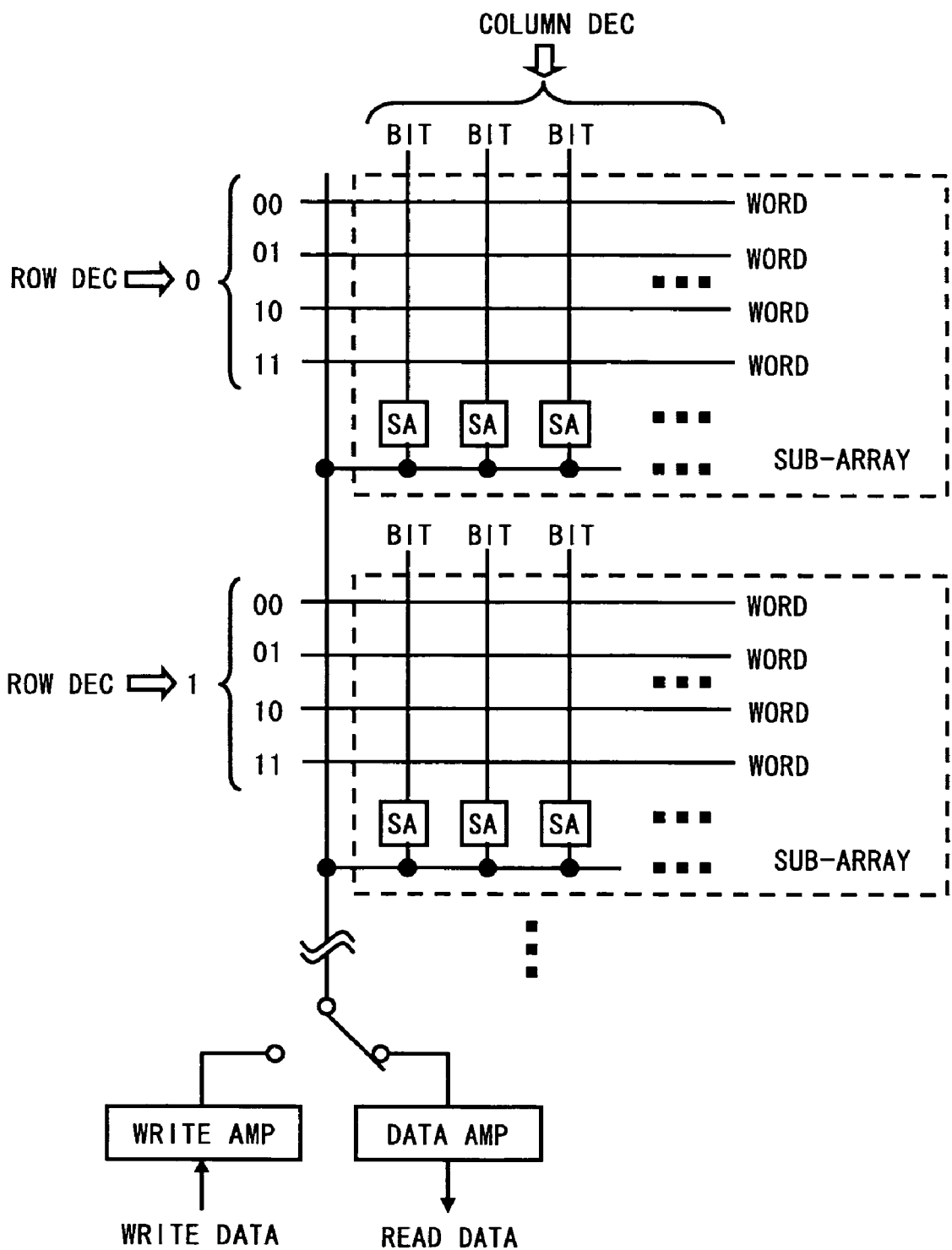
FIG. 7 is a circuit diagram showing a sub-array of DRAM according to the first embodiment of the invention.

In this embodiment, the refresh operation refresh the refresh address and the defective address at the same time in some cases. In such cases, it is necessary to select a plurality of word lines. The simultaneous selection of word lines is detailed herein. The memory cell array 109 includes a plurality of sub-arrays, which is a smaller unit of a memory cell. FIG. 7 shows the pattern diagram of the sub-arrays. The sub-arrays shown in FIG. 7 have word lines of low-order 2 bits of the row address designated by the row DEC and a plurality of bit lines designated by the column DEC. A sense amplifier SA is connected to each bit line. Specifically, in the sub-array, the low-order 2 bits of the row address of the memory cell is connected to one sense amplifier SA, thereby reducing the loads of the sense amplifier. In the refresh operation, the sense amplifier SA carries out the detection of the voltage of the memory cell and the recharge.

Figure 8:
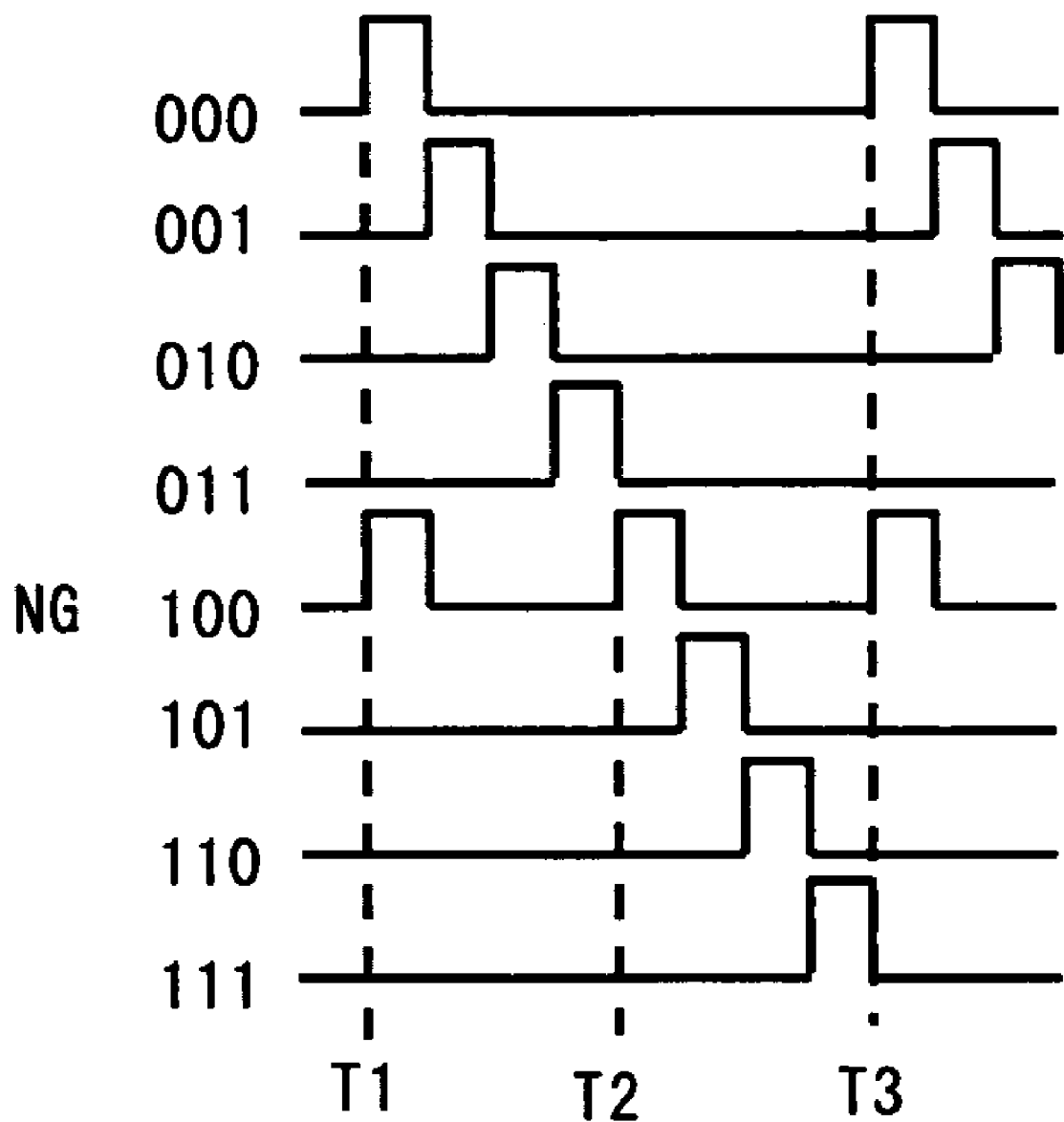
FIG. 8 is a timing chart of refresh operation according to the first embodiment of the invention.

FIG. 8 shows the timing chart of the simultaneous selection of word lines and the refresh operation with the use of the above sub-arrays. The case where the refresh operation is performed sequentially on the row addresses "000" to "111" when the row address "100" is a defective address is described herein. The description is given on the DRAM which has the sub-arrays where the low-order 2 bits of row address are one control unit as shown in FIG. 7. At timing T1, the normal refresh operation on "000" is performed. Since the low-order 2 bits of "100" and "000" are the same (i.e. "00"), the refresh operation is performed also on "100". After that, the refresh operation is performed sequentially from "001" to "011". Then, at timing T2, the normal refresh operation on "100" is performed. After that, the refresh operation is performed sequentially from "101" to "111". At timing T3, "000" and "100" are refreshed again. Subsequently, the operation from T1 to T3 is repeated.

On the other hand, a write and read command to the memory cell is randomly input to the DRAM 100 from the outside. Therefore, the function to make an adjustment to prevent the conflict of the refresh operation and the external access is required. The refresh operation including this function is described hereinbelow.

Figure 9:
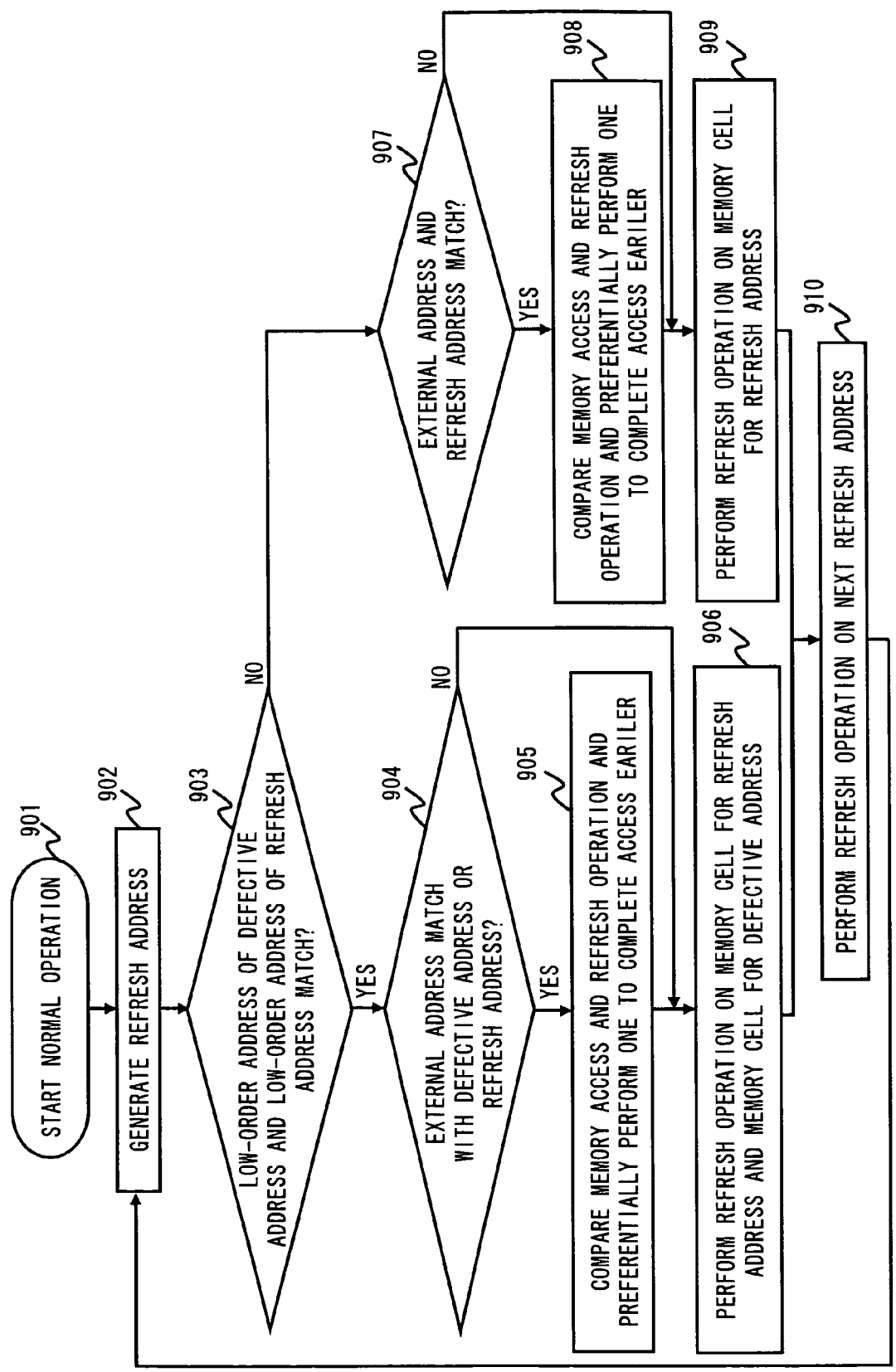
FIG. 9 is a flowchart of refresh operation when external access occurs according to the first embodiment of the invention.

FIG. 9 shows the flowchart of the refresh operation where an external access is occurring. The refresh operation is described herein with reference to FIG. 9. The normal operation is started upon completion of the self-test (Step 901). After the start of the normal operation, the refresh counter 102 generates a refresh address (Step 902).

The refresh address is input to the refresh controller 103. The refresh controller 103 compares the low-order address of the defective address which is stored in the address storage 201 with the low-order address of the refresh address (Step 903). If the low-order address of the defective address and the low-order address of the refresh address match, it then compares the external address with the defective address and the refresh address (Step 904). If the external address matches either one of the defective address and the refresh address, the refresh controller 103 compares the memory access with the refresh operation and, in light of the value of the timer, preferentially performs the one which completes the access to the memory cell earlier (Step 905).

After Step 905 ends, the process refreshes the memory cell which is connected to the word lines designated by the refresh address and the defective address (Step 906).

On the other hand, if the external address and the refresh address do not match in Step 904, the process proceeds to Step 906 without performing the processing of Step 905. After completing the refresh on the refresh address, the next refresh operation is performed (Step 910).

If the low-order address of the defective address and the low-order address of the refresh address do not match in Step 903, the process determines whether the refresh address matches the external address or not (Step 907). If the addresses match in Step 907, the process performs the same processing as in Step 905 (Step 908). After completing Step 908, the process refreshes the memory cell connected to the word line which is designated by the refresh address (Step 909).

If the addresses do not match in Step 907, the process proceeds to Step 909. After completing the refresh on the refresh address, the next refresh operation is performed (Step 910). The refresh operation is implemented by repeatedly performing the processing from Step 902 to Step 910.

The DRAM 100 of the first embodiment allows the memory cell with degraded charge holding characteristics to meet the product specifications apparently by storing the address of a defective memory cell and shortening the refresh cycle for the stored address under the control of the refresh controller 103. The DRAM 100 which has the memory cell with degraded charge holding characteristics can thereby meet the product specifications, thus increasing the process yield of the DRAM 100.

Further, the memory cell whose charge holding characteristics are degraded after shipment can also have redundancy in this embodiment, thus allows reduction of the number of DRAM 100 which becomes defective after shipment, thereby improving the product reliability.

Furthermore, the DRAM 100 of the first embodiment does not need a spare memory cell since the memory cell has redundancy. Thus, the DRAM 100 is capable of having redundancy even with a small chip size. Since the DRAM 100 of the first embodiment does not need a spare memory cell, it does not require comparison with an input external address and conversion in memory access. Further, since it is only necessary to set a shorter refresh cycle for a defective memory cell, there is no limit to the number of defective memory cells to have redundancy. Thus, even if all memory cells are degraded, for example, it is possible to allow all the memory cells to have redundancy.

In the refresh operation described above, the access control upon input of an external address is the operation that is normally implemented in the DRAM 1000 of related art. It is, however, specific to this embodiment to take a defective address into consideration upon comparison of an external address and an address to be refreshed. The comparison between the defective address and the external address is not always performed, and the comparison operation itself ends in a very short time. Hence, the DRAM 100 of the first embodiment enables an increase in access speed, thus achieving the DRAM 100 with redundancy and a high access speed.

Second Embodiment

DRAM 300 according to a second embodiment of the present invention includes a first area (e.g. code area) which stores system data and a second area (e.g. work area) which stores processing data to be processed by an external device such as CPU. The system data stored in the code area is data to configure the basic operation of the system, for example, and therefore the size of the system data is smaller than the size of the processing data. Thus, the memory area of the code area is smaller than the memory area of the work area.

A system having DRAM typically writes the system data stored in the code area of the DRAM onto nonvolatile memory when the system is stopped. Then, the system loads the written system data back to the DRAM or loads system data such as basic input output system (BIOS) into the DRAM when the system is started.

Figure 10:
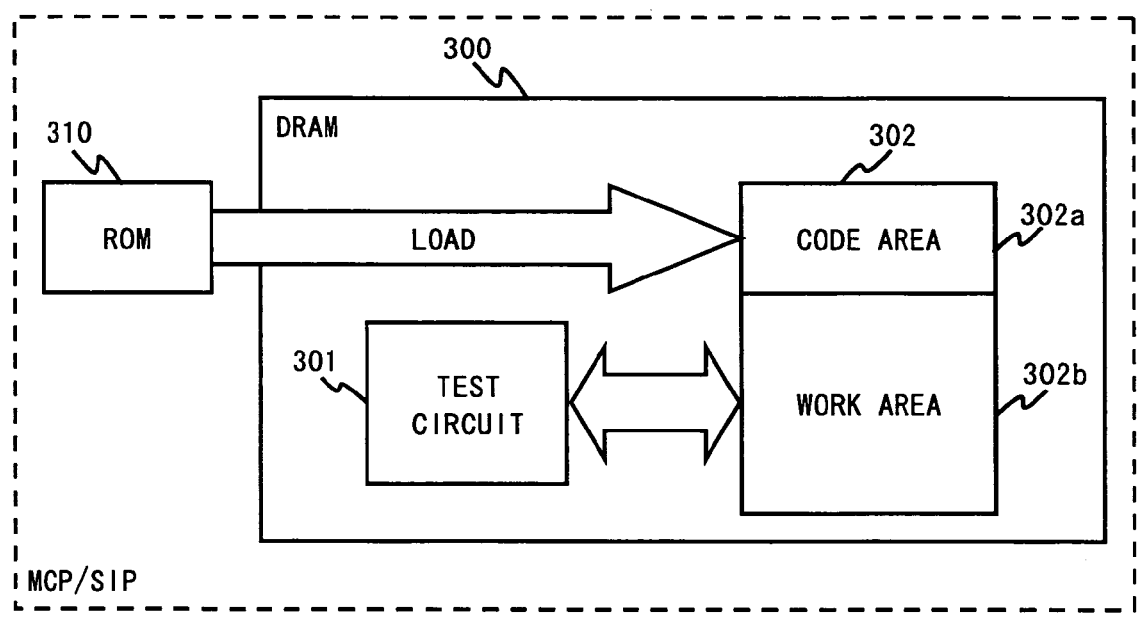
FIG. 10 is a block diagram of DRAM according to a second embodiment of the invention.

When loading the system data upon system startup, the DRAM 300 of the second embodiment performs the self-test and the loading of the system data at the same time during the self-test period after the startup of the DRAM 300. FIG. 10 shows a block diagram of the DRAM 300 according to the second embodiment.

As shown in FIG. 10, the DRAM 300 according to the second embodiment includes a test circuit 301 and a memory 302. The DRAM 300 is substantially the same as the DRAM in the first embodiment. The test circuit 301, for example, integrates the blocks other than the memory cell array 109 in the first embodiment into one block and executes the self-test of the memory 302 upon power-on. The memory 302 is equivalent to the memory cell array 109 in the first embodiment. Further, a read only memory (ROM) 310, which is a nonvolatile memory, is placed outside of the DRAM 300. In this embodiment, the DRAM 300 and the ROM 310 are mounted in different chips, and the two chips are sealed in one package, forming multi-chip package (MCP) or system in package (SIP).

The memory 302 includes a code area 302*a* and a work area 302*b*. The code area 302*a* stores the system data in the ROM 310. The work area 302*b* stores the processing data which is used for the processing of CPU, for example. The code area 302*a* and the work area 302*b* are formed in different sub-arrays, for example. Thus, as shown in the first embodiment, it is possible to perform the access operation and the refresh operation on the memory cells connected to the word lines which are designated by the same low-order 2 bits in different sub-arrays even if the row addresses are different, as long as the low-order 2 bits of those row addresses are the same. Therefore, the work area 302*b* can perform the refresh operation during the period when an external access is made to the code area 302*a*, for example.

Figure 11:
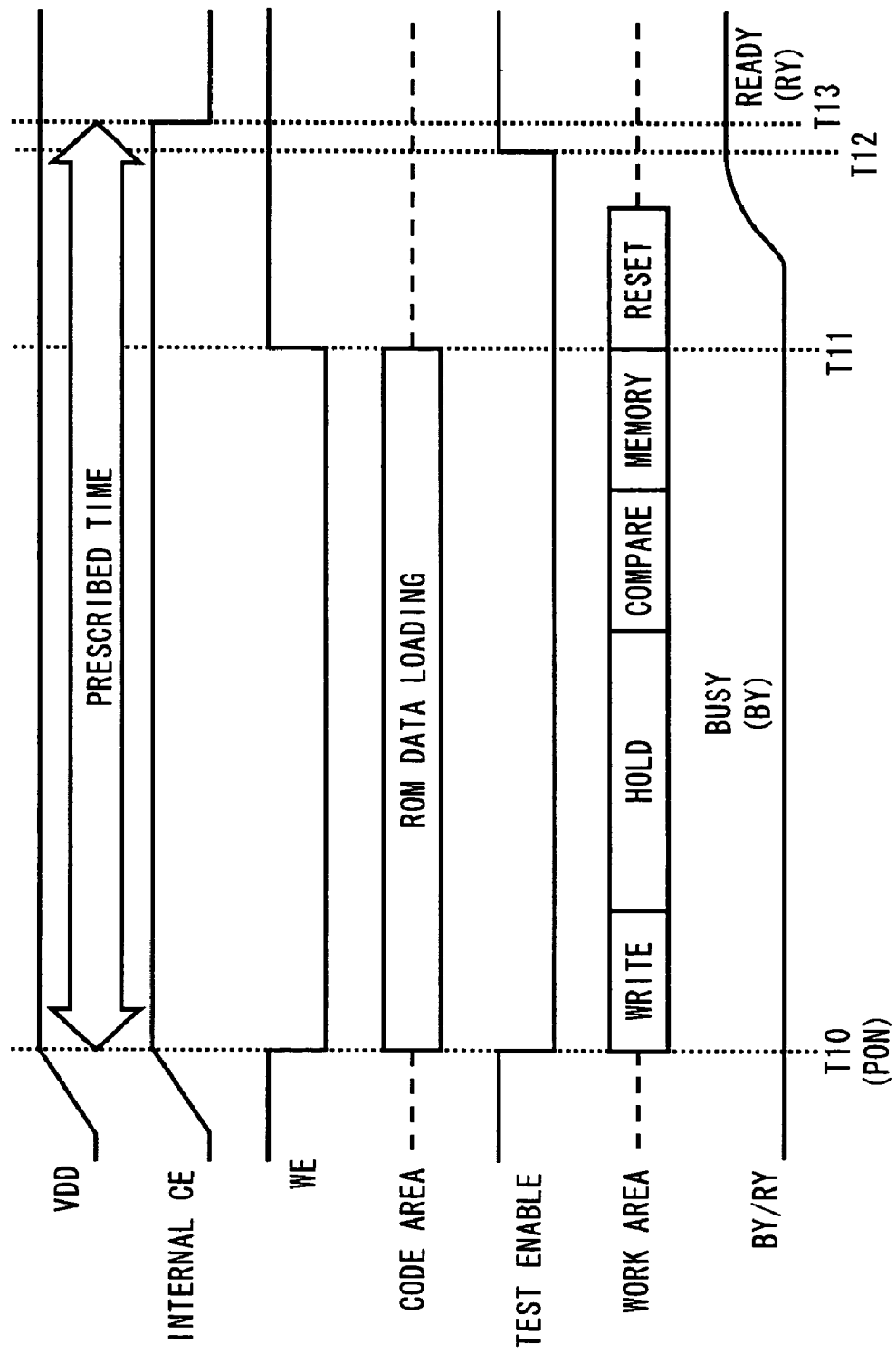
FIG. 11 is a timing chart of the operation of DRAM according to the second embodiment of the invention.
Figure 12:
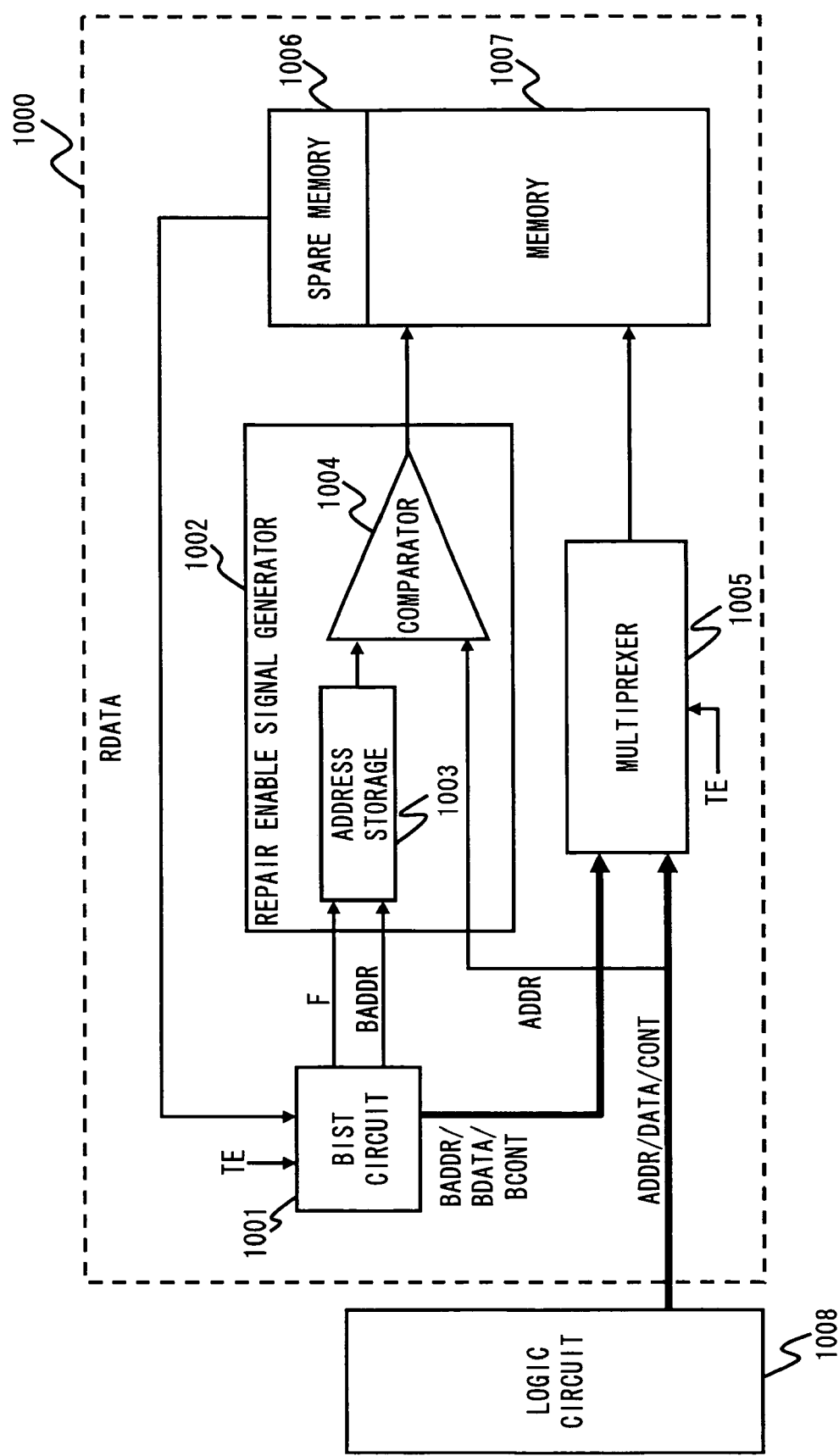
FIG. 12 is a block diagram of DRAM of related art.
Figure 13:
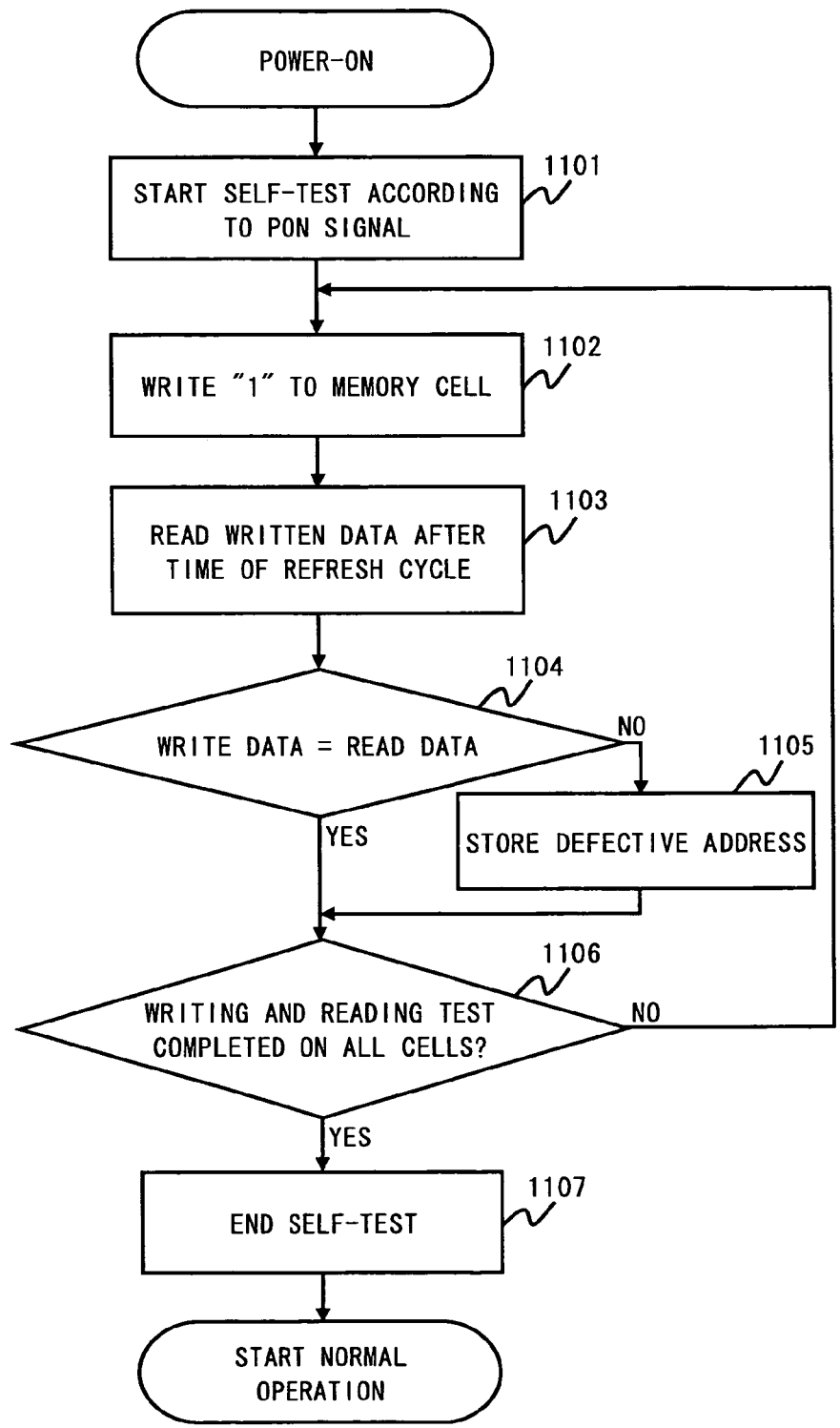
FIG. 13 is a flowchart of self-test of related art.

The operation of the DRAM 300 according to the second embodiment is described hereinafter with reference to the timing chart of FIG. 11. The DRAM 300 of the second embodiment performs the self-test on the work area 302*b* each power-on while performs the self-test on the code area 302*a* once in several times of power-on. In the following, the power-on operation in the case of not performing the self-test on the code area 302*a* is described as an example.

At timing T10, a power supply voltage VDD is supplied to the DRAM 300, and an internal chip enable signal (Internal CE) rises with the power supply voltage VDD. Also at timing T10, the write signal WE falls so that the memory 302 enters the write enable state, and the test enable signal TE falls so that the work area 302*b* enters the self-test mode. The code area 302*a* thereby starts reading the data in the ROM, and the work area 302*b* starts the self-test. The internal chip enable signal may be a signal output from the access controller 101 in the test circuit 301, for example, and designates either one of the operation state and the standby state of the chip to the circuits other than the access controller 101 in the test circuit 301. The internal chip enable signal sets the chip to the standby state when it is Low level, for example, so that the chip enters the low power consumption mode.

At this time, a BY/RY signal is Low level, and the DRAM 300 is thereby in the busy state where no other processing is performed until the current processing ends. The BY/RY signal maybe a signal output from the access controller 101 in the test circuit 301, for example, and transmitted to other chips to give notice to the outside that the DRAM 300 is in the busy state when the signal is Low level. The BY/RY signal maybe used only inside the DRAM 300. It is feasible to eliminate the BY/RY signal depending on specifications by setting to prohibit the access for a prescribed period of time from PON (timing T10), which is for example a period from PON to the fall of the internal chip enable signal.

Then, at timing T11 when the loading of data from the ROM 310 to the code area 302*a* ends, the write enable signal rises and the DRAM 300 enters the external write disable state. At this time, the work area 302*b* undergoes the self-test. The self-test starts at timing T10 and ends at timing T12 which is the time after timing T11. During the period from timing T10 to T12, the self-test which is described in the first embodiment with respect to FIG. 5 is performed. For instance, the test performs the write operation to write "1" to all the memory cells in the work area (Step 502). The hold operation to hold the state of the memory cell for a period of time corresponding to the refresh cycle and then read the write data follows (Step 503). The test further performs the compare operation to compare the write data and the read data (Step 504) and, if the comparison result shows that the write data and the read data do not match, performs the memory operation to store the address of the memory cell (Step 505). Finally performed is the reset operation to write "0" to initialize the memory cells where the self-test has been completed.

When the reset operation is started in the self-test, the BY/RY signal rises and reaches High level at timing T12. At timing T12, the test enable signal changes from Low level to High level. In response to the change in the test enable signal, the internal chip enable signal changes from High level to Low level at timing T13. The DRAM 300 thereby enters the standby state which waits for an external address with reduced power consumption.

As described in the foregoing, the DRAM 300 of the second embodiment uses a part of a plurality of sub-arrays formed on the memory 302 as the code area 302*a* and a remaining part as the work area 302*b*. The memory 302 assigns the address of the low-order 2 bits of the row address, for example, to the address for designating the word line of each sub-array as described in the first embodiment. Thus, the DRAM 300 of the second embodiment is capable of performing the access operation and the refresh operation on different sub-arrays by using different row addresses with the same low-order 2 bits. Thus, the DRAM 300 of the second embodiment can load the system data to the code area 302*a* at the same time as the self-test on the work area 302*b* after power-on. The DRAM 300 of the second embodiment can thereby perform the self-test and the loading of the system data in a shorter time compared with the case of loading the system data after completing the self-test, which shortens the time for start-up processing.

Though the self-test is not performed on the code area 302*a* in the above embodiment, the case of performing the self-test on the code area 302*a* may be as follows. In this case, the self-test on the code area 302*a* is carried out first and then the loading of the system data into the code area 302*a* and the execution of the self-test on the work area 302*b* are carried out simultaneously. Since the work area 302*b* is small sized and the time for the self-test is short, performing the processing in this order suppresses an increase in startup time.

As for the frequency to carryout the self-test upon power-on, it is feasible to perform the self-test on the code area 302*a* and the work area 302*b* each time the power is turned on, and the frequency may be varied.

The present invention is not restricted to the above-described embodiments but may be altered in various ways. For example, the settings of the refresh cycle for a defective address may be regardless of the address as long as it is shorter than the refresh cycle for a normal memory cell. The refresh cycle for a defective address may be varied in accordance with a defective memory cell, such as ½, ¼ or ⅛ of the normal refresh cycle.

The adjustment of the refresh operation upon occurrence of the external access during the refresh operation is not restricted to that described in the above embodiments as long as the operation is controlled so that the memory cell to be refreshed and the memory cell to be accessed do not conflict.

Further, the self-test may be carried out at a given timing, not in response to power-on. In addition, it is feasible to perform the self-test not upon each power-on but at a given cycle by using a nonvolatile memory cell for an address storage.

It is apparent that the present invention is not limited to the above embodiment that may be modified and changed without departing from the scope and spirit of the invention.

What is claimed is:

1. A volatile semiconductor memory comprising:
   a self-test controller detecting a defect of a memory cell;
   an address storage storing a defective address indicating an address of a defective memory cell; and
   a refresh adjust circuit setting a refresh cycle of a memory cell designated by the defective address to be shorter than a refresh cycle of a normal memory cell.

2. The volatile semiconductor memory according to claim 1, further comprising:
   a refresh counter generating a refresh address.

3. The volatile semiconductor memory according to claim 2, wherein the refresh counter generates a row address and a column address to designate a memory cell where data is to be written or read when executing self-test including detecting a defect of a memory cell and storing a defective address designating an address of a defective memory cell, and generates a refresh address to designate a row of a memory cell to be refreshed when performing refresh operation for holding data.

4. The volatile semiconductor memory according to claim 2, wherein the refresh adjust circuit outputs a refresh activation signal for refreshing a memory cell connected to a word line designated by the refresh address and a memory cell connected to a word line designated by the defective address when a low-order address of the refresh address and a low-order address of the defective address match.

5. The volatile semiconductor memory according to claim 3, wherein the refresh adjust circuit outputs a refresh activation signal for refreshing a memory cell connected to a word line designated by the refresh address and a memory cell connected to a word line designated by the defective address when a low-order address of the refresh address and a low-order address of the defective address match.

6. The volatile semiconductor memory according to claim 1, wherein the refresh adjust circuit outputs a refresh activation signal for refreshing a memory cell connected to a word line designated by a refresh address generated by a refresh counter and a memory cell connected to a word line designated by the defective address when a low-order address of the refresh address and a low-order address of the defective address match.

7. The volatile semiconductor memory according to claim 1, wherein the refresh adjust circuit selects one from refresh operation and memory access operation according to an external address upon input of an external address that matches at least one of a refresh address to be refreshed and the defective address.

8. The volatile semiconductor memory according to claim 7, wherein the refresh adjust circuit selects one from refresh operation and memory access operation according to an external address is a function to give priority to one of the refresh operation and the memory access operation according to an external address which accesses to a memory cell earlier according to a value of a timer to set a refresh cycle.

9. The volatile semiconductor memory according to claim 1, wherein a self-test including detecting a defect of a memory cell and storing a defective address indicating an address of a defective memory cell is executed in response to power-on to the volatile semiconductor memory.

10. The volatile semiconductor memory according to claim 9, wherein the self-test can be stopped according to an external signal.

11. The volatile semiconductor memory according to claim 9, wherein the self-test is executed at the same time as data loading from a nonvolatile memory outside the volatile semiconductor memory.

12. The volatile semiconductor memory according to claim 9, wherein the volatile semiconductor memory comprises a first area for storing system data and a second area for storing processing data used in an external device within a memory area where a memory cell is placed, and simultaneously performs execution of the self-test on the second area and loading of the system data from an external nonvolatile memory into the first area.

13. A volatile semiconductor memory to perform self-test for detecting a defect of a memory cell, comprising:
    a refresh counter generating a row address and a column address to designate a memory cell where data is to be written or read when executing the self-test, and generates a refresh address to designate a row of a memory cell to be refreshed when performing refresh operation for holding data;
    a self-test controller detecting a defect of a memory cell;
    an address storage for storing a defective address indicating an address of a defective memory cell; and
    a refresh adjust circuit setting a refresh cycle of a memory cell designated by the defective address to be shorter than a refresh cycle of a normal memory cell.

14. The volatile semiconductor memory according to claim 13, wherein, when the refresh address and the defective address match in the refresh operation, the refresh counter outputs the refresh address and the defective address.

15. The volatile semiconductor memory according to claim 13, wherein a self-test including detecting a defect of a memory cell and storing a defective address indicating an address of a defective memory cell is executed in response to power-on to the volatile semiconductor memory.

16. The volatile semiconductor memory according to claim 15, wherein the self-test can be stopped according to an external signal.

17. The volatile semiconductor memory according to claim 15, wherein the self-test is executed at the same time as data loading from a nonvolatile memory outside the volatile semiconductor memory.

18. The volatile semiconductor memory according to claim 15, wherein the volatile semiconductor memory comprises a first area storing system data and a second area storing processing data used in an external device within a memory area where a memory cell is placed, and simultaneously performs execution of the self-test on the second area and loading of the system data from an external nonvolatile memory into the first area.

19. A volatile semiconductor memory comprising:
    a memory cell array which has a plurality of cells;
    a self-test controller comparing a first data to be written into a selected cell of the cells and a second data actually read from the selected cell of the cells and outputting a comparison result; and
    a refresh controller controlling a refresh cycle of the selected cell in response to the comparison result.

* * * * *